US012685111B2

(12) United States Patent
van der Straten et al.

(10) Patent No.: US 12,685,111 B2
(45) Date of Patent: Jul. 14, 2026

(54) SEMICONDUCTOR STRUCTURES INCLUDING METAL WIRES WITH EDGE CURVATURE

(71) Applicant: International Business Machines Corporation, Armonk, NY (US)

(72) Inventors: Oscar van der Straten, Guilderland Center, NY (US); Shanti Pancharatnam, Albany, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 549 days.

(21) Appl. No.: 18/169,984

(22) Filed: Feb. 16, 2023

(65) Prior Publication Data

US 2024/0282630 A1      Aug. 22, 2024

(51) Int. Cl.
| | |
|---|---|
| *H01L 21/768* | (2006.01) |
| *H01L 23/522* | (2006.01) |
| *H01L 23/528* | (2006.01) |
| *H01L 23/532* | (2006.01) |

(52) U.S. Cl.
CPC .. *H01L 21/76879* (2013.01); *H01L 21/76802* (2013.01); *H01L 21/76831* (2013.01); *H01L 23/5226* (2013.01); *H01L 23/528* (2013.01); *H01L 23/53266* (2013.01)

(58) Field of Classification Search
CPC ......... H01L 21/76816; H01L 21/76879; H01L 21/76802; H01L 21/76831; H01L 23/528; H01L 23/5283
See application file for complete search history.

(56) References Cited

U.S. PATENT DOCUMENTS

| | | | |
|---|---|---|---|
| 5,727,727 A | 3/1998 | Ead | |
| 6,122,171 A | 9/2000 | Akram | |
| 6,278,184 B1 | 8/2001 | Brofman | |
| 6,469,394 B1 * | 10/2002 | Wong ...................... | H01L 24/16 |
| | | | 257/E21.511 |
| 6,631,078 B2 | 10/2003 | Alcoe | |
| 6,960,519 B1 | 11/2005 | Dalton | |
| 8,759,949 B2 | 6/2014 | Yu | |
| 9,418,889 B2 | 8/2016 | Mountsier | |
| 9,502,350 B1 * | 11/2016 | Bonilla ............. | H01L 23/53228 |
| 9,613,853 B2 | 4/2017 | Chen | |
| 9,685,373 B2 | 6/2017 | Ko | |
| 10,256,186 B2 | 4/2019 | Bonilla | |
| 10,269,676 B2 | 4/2019 | Chiang | |
| 10,332,818 B2 | 6/2019 | Morianz | |

(Continued)

OTHER PUBLICATIONS

Jaromir Bilek et al., "Thermal conductivity of molten lead-free solders." International Journal of Thermophysics, vol. 27, No. 1, 2006, pp. 92-102.
List of IBM Patents or Patent Applications Treated as Related, Feb. 15, 2023, 2 pgs.
Pat Gelsinger, "Intel Accelerated," Presentation, 2021, https:// download.intel.com/newsroom/2021/client-computing/Intel-Accelerated-2021-presentation.pdf Download from the Internet Jan. 11, 2022.

(Continued)

*Primary Examiner* — John M Parker
(74) *Attorney, Agent, or Firm* — Kimberly Zillig

(57)      ABSTRACT

A semiconductor structure that includes: a plurality of metal wires, and at least one dielectric substrate surrounding the plurality of metal wires. Each of the plurality of metal wires includes a tapered upper portion, a tapered lower portion, and a middle portion between the tapered upper portion and the tapered lower portion that is wider than the tapered upper and lower portions.

14 Claims, 9 Drawing Sheets

100

(56) References Cited

U.S. PATENT DOCUMENTS

| | | | |
|---|---|---|---|
| 10,541,218 B2 | 1/2020 | Cheng | |
| 10,580,696 B1 | 3/2020 | Lin | |
| 10,636,739 B2 | 4/2020 | Beyne | |
| 11,114,395 B2 | 9/2021 | Lin | |
| 2006/0189133 A1* | 8/2006 | Dimitrakopoulos | ......................... H01L 23/53295 438/618 |
| 2009/0115026 A1 | 5/2009 | Gerber | |
| 2009/0115064 A1* | 5/2009 | Sandhu | ............... H01L 21/0338 257/773 |
| 2011/0186990 A1 | 8/2011 | Mawatari | |
| 2013/0280879 A1* | 10/2013 | Stecher | ............. H01L 21/31144 257/E21.022 |
| 2017/0373006 A1* | 12/2017 | Adusumilli | ....... H01L 21/76816 |
| 2022/0181237 A1 | 6/2022 | Yen | |
| 2022/0262791 A1 | 8/2022 | Shi | |
| 2022/0270985 A1 | 8/2022 | Ananiev | |
| 2023/0403944 A1* | 12/2023 | van der Strate | ....... H10N 50/80 |
| 2024/0113018 A1* | 4/2024 | van der Straten | ......................... H01L 21/76885 |

OTHER PUBLICATIONS

Farooq et al., "Wafer Dies With Thermally Conducting Perimeter Regions," U.S. Appl. No. 18/080,034, filed Dec. 13, 2022.

Van Der Straten, O. et al, "Octagonal Interconnect Wiring for Advanced Logic," U.S. Appl. No. 18/145,157, filed Dec. 22, 2022 (41 pgs).

Van Der Straten, O. et al, "Low Resistance Semiconductor Interconnect Structure," U.S. Appl. No. 18/179,417, filed Mar. 7, 2023, 36 pgs.

Van Der Straten, O. et al, "Metal Wires with Expanded Sidewalls," U.S. Appl. No. 18/190,175, filed Mar. 27, 2023, 55 pgs.

Van Der Straten, O. et al, "Terraced Conductor Structure for Semiconductor Devices," U.S. Appl. No. 18/346,999, filed Jul. 5, 2023, 42 pgs.

Van Der Straten, O. et al, "Wiring Structure for Advanced Interconnect," U.S. Appl. No. 18/179,421, filed Mar. 7, 2023, 38 pgs.

* cited by examiner

100

104
102

100

100

100

100

100

200

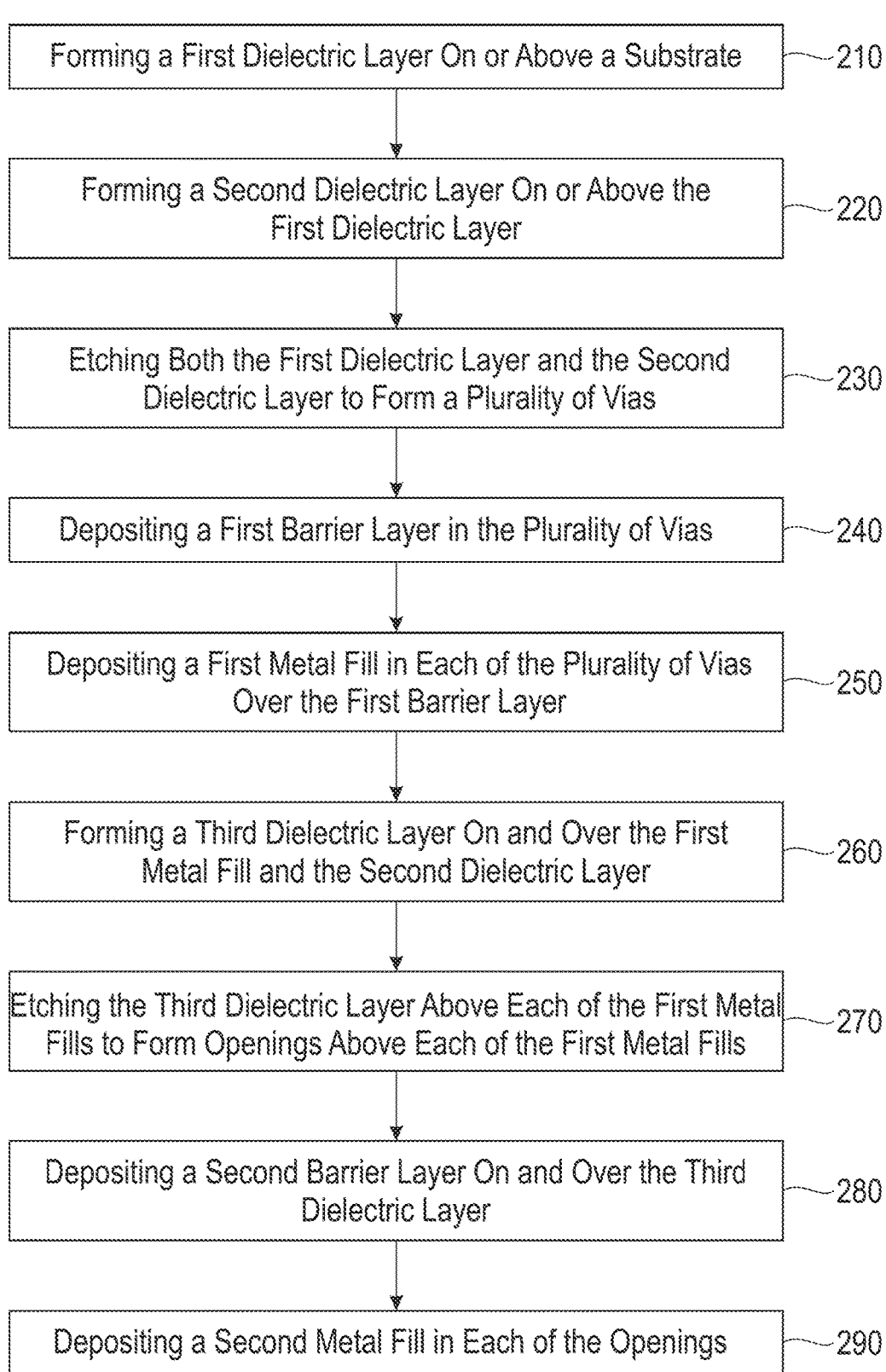

Forming a First Dielectric Layer On or Above a Substrate — 210

Forming a Second Dielectric Layer On or Above the First Dielectric Layer — 220

Etching Both the First Dielectric Layer and the Second Dielectric Layer to Form a Plurality of Vias — 230

Depositing a First Barrier Layer in the Plurality of Vias — 240

Depositing a First Metal Fill in Each of the Plurality of Vias Over the First Barrier Layer — 250

Forming a Third Dielectric Layer On and Over the First Metal Fill and the Second Dielectric Layer — 260

Etching the Third Dielectric Layer Above Each of the First Metal Fills to Form Openings Above Each of the First Metal Fills — 270

Depositing a Second Barrier Layer On and Over the Third Dielectric Layer — 280

Depositing a Second Metal Fill in Each of the Openings — 290

FIG. 15

SEMICONDUCTOR STRUCTURES INCLUDING METAL WIRES WITH EDGE CURVATURE

BACKGROUND

The present disclosure relates to semiconductor wafer processing. More particularly, the present disclosure provides semiconductor structures including metal wires with edge curvature and a widened middle portion.

Damascene processing is a method for forming interconnects on integrated circuits. It involves formation of inlaid metal wires in trenches and vias etched into a dielectric layer (inter layer dielectric or ILD). In a typical damascene process flow, copper is deposited onto a patterned dielectric to fill the vias and trenches etched into the dielectric layer.

SUMMARY

According to some embodiments of the disclosure, there is provided a semiconductor structure. The semiconductor structure includes: a plurality of metal wires, and at least one dielectric substrate surrounding the plurality of metal wires. Each of the plurality of metal wires includes a tapered upper portion, a tapered lower portion, and a middle portion between the tapered upper portion and the tapered lower portion that is wider than the tapered upper and lower portions.

According to some embodiments of the disclosure, there is provided a semiconductor structure. The semiconductor structure includes: a plurality of metal wires, and at least one dielectric substrate surrounding the plurality of metal wires. Each of the plurality of metal wires includes a curved upper portion, a curved lower portion, and a middle portion between the curved upper portion and the curved lower portion that is includes substantially straight sidewalls and is wider than the curved upper and lower portions.

According to some embodiments of the disclosure, there is provided a method of manufacturing a semiconductor structure. The method includes forming a first dielectric substrate on and over a substrate, wherein the first dielectric substrate includes a density gradient, and forming a second dielectric substrate on and over the first dielectric substrate. The method further includes etching both the first dielectric substrate and the second dielectric substrate to form a plurality of vias, wherein after the etching, the second dielectric substrate forms substantially straight sidewalls of the plurality of vias and the first dielectric substrate includes curved or tapered edges that extend inward from the substantially straight sidewalls and expose the substrate between the curved or tapered edges. The method further includes depositing a first barrier layer in the plurality of vias, and depositing a first metal fill in each of the plurality of vias over the first barrier layer. Additionally, the method includes forming a third dielectric substrate on and over the first metal fill and the second dielectric substrate, wherein the third dielectric substrate includes an inverse density gradient, and etching the third dielectric substrate above each of the first metal fills to form openings above each of the first metal fills, wherein after the etching, the third dielectric substrate includes curved or tapered edges that extend inward in the openings. The method also includes depositing a second barrier layer on and over the third dielectric substrate after etching, and depositing a second metal fill in each of the openings, wherein one of the first metal fills and one of the second metal fills together form a metal wire in the semiconductor structure.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

FIG. 15 is a flow diagram for a process of making semiconductor structures including metal wires with edge curvature and a widened middle portion.

Figure 1:
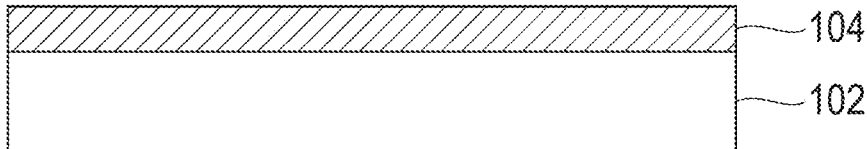
FIG. 1 is a cross-sectional view of a semiconductor stack structure at an early fabrication operation in successive fabrication operations of a process of forming semiconductor structures including metal wires with edge curvature and a widened middle portion, in accordance with embodiments of the disclosure.

While the disclosure is amenable to various modifications and alternative forms, specifics thereof have been shown by way of example in the drawings and will be described in detail. It should be understood, however, that the intention is not to limit the disclosure to the particular embodiments described. On the contrary, the intention is to cover all modifications, equivalents, and alternatives falling within the spirit and scope of the disclosure.

DETAILED DESCRIPTION

Aspects of the present disclosure relate to semiconductor wafer processing. More particularly, the present disclosure provides semiconductor structures including metal wires (i.e., metal interconnects) with edge curvature and a widened middle portion. While the present disclosure is not necessarily limited to such applications, various aspects of the disclosure can be appreciated through a discussion of various examples using this context.

When back-end-of-line (BEOL) semiconductor technology is scaled down to smaller and smaller dimensions, issues can arise with metal wire structures in the semiconductors that are not seen when using larger dimensions. Copper may not be used as a metal fill in the semiconductors with smaller dimensions as copper deposition on a dielectric layer requires a number of barrier or liner layers in between, which can take up valuable space. A metal, such as ruthenium (Ru), does not require as many barrier or liner layers and can be used for metallization, for example, in the semiconductors with smaller dimensions. However, the use of Ru, for example, in a metallization process has been found to cause distortion of the dielectric layer that is deposited prior to metallization. Stress is imparted on the dielectric layer by the metal, such as Ru, as a result of the metallization process in the formation of metal wires. Another term that is used to describe the distortion of the dielectric layer is called "line wiggling." The distortion of the dielectric layer results in variation in the size (e.g., width) and shape of trenches formed in the dielectric layer into which metal is deposited during the metallization process. As a result, the metal wires formed in the trenches by metallization also vary in size and shape. The size and shape variation of the metal wires with respect to each other is known as "critical dimension (CD) variability." The CD variability of the metal wires is not desired and can result in variability in resistance values of the metal wires in resultant semiconductors.

For BEOL pitch below thirty (30) nanometers (nm), resistive-capacitive (RC) delay can grow unsustainably large, which results in a need for metallization of minimum CD metal wires made of materials other than Cu to enable low line resistance. However, dielectric layer distortion induced by the stress of alternative metals is a significant concern which is exacerbated by line aspect ratio. Therefore, there is a need for advanced pitch metal wire structures formed with a reduced risk of distortion.

Embodiments of the present disclosure include structures with BEOL metal wires having a widened middle portion and curved, or tapered, upper and lower sections. The middle portion can be wider than the tapered or curved upper and lower sections of the metal wires. The "locally widened" CD metal wires with wider middle portions can result in metal wires that have a low aspect ratio. An "aspect ratio" is defined as height divided by width. The middle portion can be straight and can include substantially straight sidewalls that are perpendicular to a substrate of the structure.

Embodiments of the present disclosure can include metal wires, or interconnects, at dimensions below thirty (30) nanometer (nm) pitch. "Pitch" is the spacing between objects without regard to their size in a circuit. The "pitch" of parallel conducting metal lines, or wires, is the distance between them, center to center.

Embodiments of the present disclosure can include metal wires that include a barrier layer and metal fill. The metal fill is a material that can be chosen, for example, from a group consisting of ruthenium, tungsten, cobalt, iridium and rhodium. A property of these materials is that when the materials are deposited on a dielectric layer the materials do not require a number of barrier or liner layers in between, which can take up valuable space. A metal, such as ruthenium (Ru), does not require as many barrier or liner layers and can be used for metallization, for example, in the semiconductors with smaller dimensions. The barrier layer is a material that can be chosen, for example, from a group consisting of titanium nitride, tantalum nitride and niobium nitride. The metal wires can include a plurality of metal fill layers each including portions thereof having a low aspect ratio.

Embodiments of the present disclosure can include at least one dielectric layer (otherwise referred to as a "dielectric substrate") surrounding a plurality of metal wires. The at least one dielectric layer can include a first dielectric layer comprising a first material containing a low-k dielectric material with a density gradient adjacent a tapered lower portion of each metal wire. A "density gradient" is a spatial variation in density over an area. The at least one dielectric layer can also include a second dielectric layer comprising a second material containing a dielectric material, Further, the at least one dielectric layer can include a third dielectric layer comprising a third material containing a low-k dielectric material with an inverse density gradient adjacent a tapered upper portion of each metal wire. The second dielectric layer can be located between the first dielectric layer and the third dielectric layer.

One feature and advantage of the disclosed structures and processes is that metal wires in the structures generally have uniform line profile and height. A reduced potential for line wiggling results in the metal wires formed by the disclosed processes. Another advantage is that the disclosed processes avoid stress induced dielectric distortion problems in metal wires in semiconductors with smaller dimensions. A further advantage is that improved metal fill results and enables formation of metal wires with no voids. In addition, another advantage is that improved semiconductor device performance results due to increased space between adjacent metal wires and, therefore, a reduced chance for shorts between the adjacent metal wires.

As used herein, the term "via" refers generally to an electrically conductive feature running substantially perpendicular to the upper surface of the semiconductor substrate. Also, the terms "line," "interconnect," and "wire" are used interchangeably, and refer generally to an electrically conductive feature running substantially parallel to the upper surface of the semiconductor substrate. Furthermore, as used herein, the term "conductive" refers to electrical conductivity, unless otherwise noted.

For the sake of brevity, conventional techniques related to semiconductor device and IC fabrication may or may not be described in detail herein. Moreover, the various tasks and process steps or operations described herein can be incorporated into a more comprehensive procedure or process having additional operations or functionality not described in detail herein.

Turning to the figures, FIGS. 1-14 are cross-sectional views of a stack structure 100 showing processing steps and respective structures in successive fabrication operations of a process of forming the stack structure 100, in accordance with embodiments of the disclosure. FIG. 1 shows a substrate 102, e.g., an integrated circuit (IC) substrate. The substrate 102 can include a semiconducting material, an insulating material, a conductive material or any combination thereof. When the substrate 102 is comprised of a semiconducting material, any semiconductor such as, for example, silicon (Si), silicon-germanium (SiGe), silicon germanium carbide (SiGeC), silicon carbide (SiC), Ge alloys, gallium arsenide (GaAs), indium arsenide (InAs), indium phosphide (InP) and other III/V or II/VI or compound semiconductors can be used. In addition to these listed types of semiconducting materials, the present disclosure also contemplates cases in which the semiconductor substrate is a bulk substrate and also cases in which the semiconductor substrate is a layered semiconductor such as, for example, Si/SiGe, Si/SiC, silicon-on-insulator (SOI) or silicon germanium-on-insulator (SGOI). When the substrate 102 is an insulating material, the insulating material can be an organic insulator, an inorganic insulator or a combination thereof including multilayers. When the substrate 102 is a conducting material, the substrate 102 may include, for example, polySi, an elemental metal, alloys of elemental metals, a metal silicide, a metal nitride or combinations thereof including multilayers. Metal layers can be included below the substrate 102 shown in FIG. 1, for example.

In the stack structure 100 of FIG. 1, a thin, first dielectric layer 104 (otherwise referred to as a "first dielectric substrate") can be formed on a surface of the substrate 102, and can include any interlevel or intralevel interconnect dielectric material including inorganic dielectrics or organic dielectrics. The "thin" first dielectric layer 104 can have a thickness ranging from about 5 nanometers (nm) to 50 nm, although values less than 5 nm and more than 50 nm are also contemplated. The dielectric material can be porous or non-porous. An example material for the first dielectric layer 104 can be a low-k dielectric material, such as e.g., graded carbon doped silicon oxides materials (SiCOH) with a density gradient. The density of the first dielectric layer 104 varies as the thickness of the first dielectric layer 104 increases. The density gradient of the first dielectric layer 104 can be selected in order for a more dense portion to be adjacent the substrate 102 and a less dense portion to be oriented away from the substrate 102, thus establishing the density gradient. The density of the first dielectric layer 104 is not uniform throughout. Some other examples of suitable dielectrics that can be used as the dielectric layer 104 include, but are not limited to, silicon dioxide ($SiO_2$), silsesquioxanes, carbon (C) doped oxides (i.e., organosilicates) that include atoms of Si, C, oxygen (O) and hydrogen (H), thermosetting polyarylene ethers, or multilayers thereof.

Figure 2:
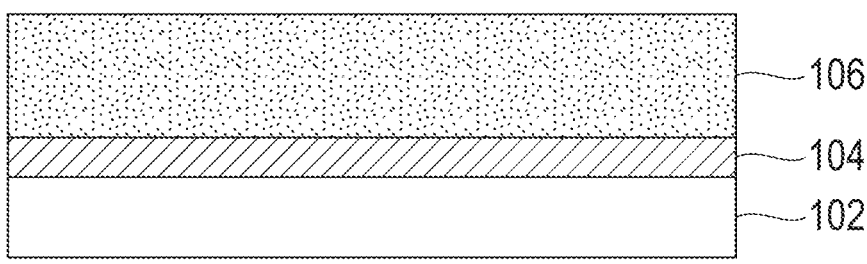
FIG. 2 is a cross-sectional view illustrating a process operation following that of FIG. 1, in accordance with embodiments of the disclosure.

FIG. 2 is a cross-sectional view illustrating a process operation following that of FIG. 1, in accordance with embodiments of the disclosure. As shown, a second dielectric layer 106 (otherwise referred to as the "second dielectric substrate") is formed over the first dielectric layer 104 and the substrate 102. The second dielectric layer 106 can be composed of any suitable material including those described with respect to the first dielectric layer 104 or a can be made of a different material from the first dielectric layer 104. An example material for the second dielectric layer 106 can be a low-k dielectric material, such as e.g., silicon oxycarbonitride (SiCNOH).

Figure 3:
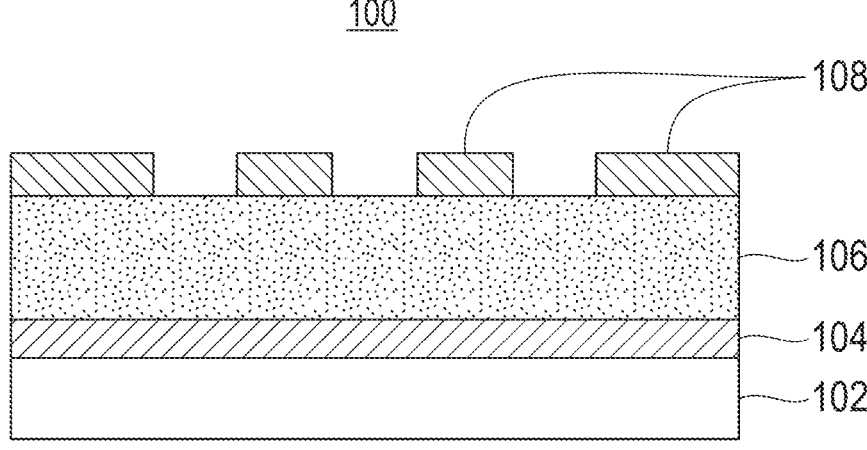
FIG. 3 is a cross-sectional view illustrating a process operation following that of FIG. 2, in accordance with embodiments of the disclosure.

FIG. 3 is a cross-sectional view illustrating a process operation following that of FIG. 2, in accordance with embodiments of the disclosure. As shown, a first hard mask layer 108 was formed directly on the second dielectric layer 106 to protect the second dielectric layer 106 from later processes performed on other layers. The first hard mask layer 108 can be formed by any method known in the art for forming a hard mask including chemical vapor deposition (CVD), plasma enhanced chemical vapor deposition (PECVD), and sputtering. For an embodiment, the first hard mask layer 108 can be formed from a bulk material such as titanium (Ti). Other bulk materials that can be used for the first hard mask layer 108 include materials known in the art, such as metal nitrides, for example. The figure also shows that patterning of the first hard mask layer 108 had been carried out to form a plurality of openings in the first hard mask layer 108. Lithography and a reactive ion etch (RIE) or a wet etch process, for example, can be used to pattern the first hard mask layer 108.

Figure 4:
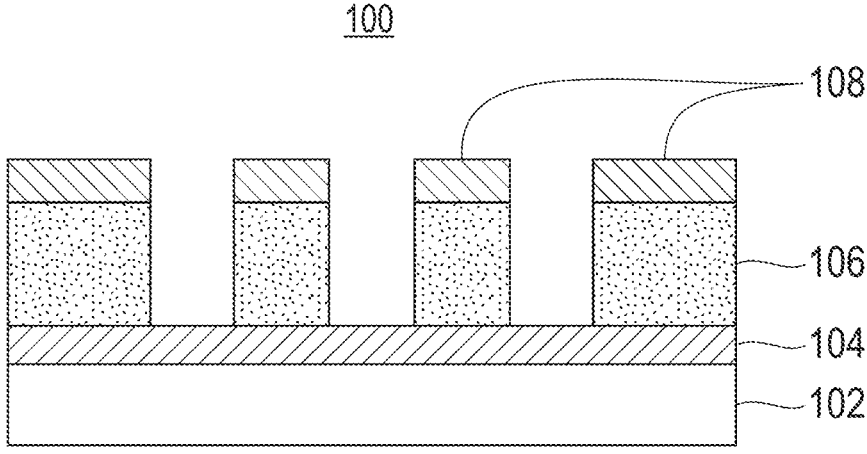
FIG. 4 is a cross-sectional view illustrating a process operation following that of FIG. 3, in accordance with embodiments of the disclosure.

FIG. 4 is a cross-sectional view illustrating a process operation following that of FIG. 3, in accordance with embodiments of the disclosure. An etching process, such as an RIE, has been used to remove portions of the second dielectric layer 106 that are not covered by the first hard mask layer 108 and are below the openings in the first hard mask layer 108. The first dielectric layer 104 is left intact as shown.

Figure 5:
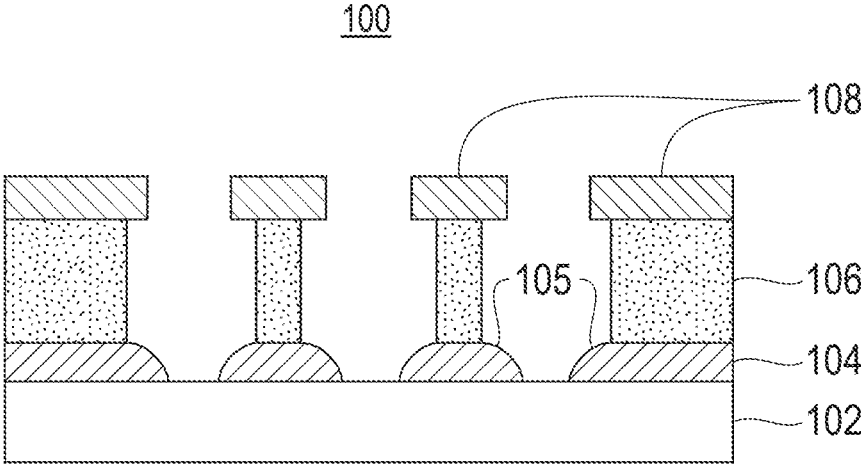
FIG. 5 is a cross-sectional view illustrating a process operation following that of FIG. 4, in accordance with embodiments of the disclosure.

FIG. 5 is a cross-sectional view illustrating a process operation following that of FIG. 4, in accordance with embodiments of the disclosure. An etching process, such as RIE, has been used to remove some portion of the first dielectric layer 104 that is not covered by the second dielectric layer 106. As shown, the first dielectric layer 104 is not completely removed due to the material used to form the first dielectric layer 104, which includes the density gradient. Due to the density gradient in the material, the first dielectric layer 104 not covered by the second dielectric layer 106 is etched away resulting in edges 105 with some curvature (or tapering) of the first dielectric layer 104 that are located adjacent the substrate 102 as shown. A portion of the substrate 102 is exposed between the edges 105 of the first dielectric layer 104. The first dielectric layer 104, after etching, can have a curved profile with edges 105 as shown, although other profiles can result. In addition to etching portions of the first dielectric layer 104, the etching process used to etch the first dielectric layer 104 also further etches some of the remaining, exposed second dielectric layer 106, which results in CD widening of the second dielectric layer 106 above the first dielectric layer 104 and below the first hard mask layer 108, as shown in the figure. An advantage of the steps in the process, resulting in FIG. 5, is that the opening etched in the first dielectric layer 104 is not too wide adjacent the substrate 102. A risk of an opening in the first dielectric layer 104 adjacent the substrate 102 being too wide is that there could be possible shorting between adjacent metal wires in the final structure of semiconductor structure 100 (metal wires 122 as in FIG. 14, discussed below).

Figure 6:
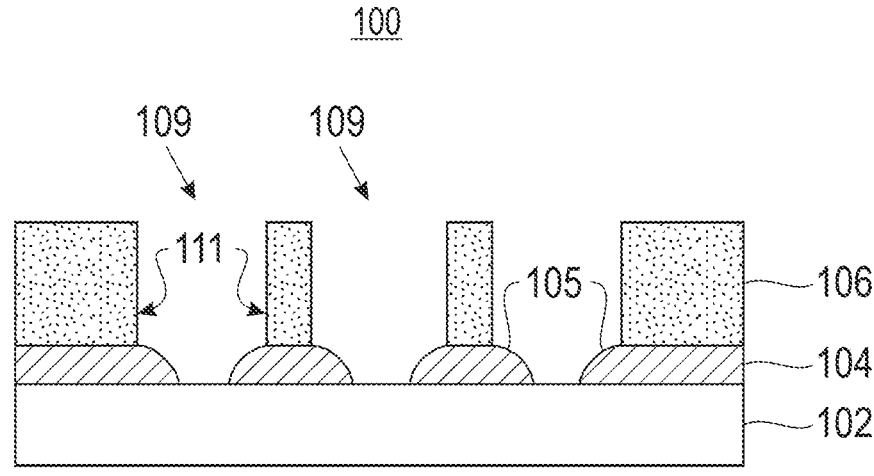
FIG. 6 is a cross-sectional view illustrating a process operation following that of FIG. 5, in accordance with embodiments of the disclosure.

FIG. 6 is a cross-sectional view illustrating a process operation following that of FIG. 5, in accordance with embodiments of the disclosure. As shown, the first hard mask layer 108 has been removed. A process that can be used to remove the remaining first hard mask layer 108 is a wet removal process or a removal by a dry etch, such as an RIE. Also, as shown, the earlier etching steps of both the first dielectric layer 104 and the second dielectric layer 106 are used to form a plurality of vias 109. After the etching, the second dielectric layer 106 forms substantially straight sidewalls 111 of the plurality of vias 109 and the first dielectric layer 104 includes curved or tapered edges 105 that extend inward from the substantially straight sidewalls 111 and expose the substrate 102 between the curved or tapered edges 105.

Figure 7:
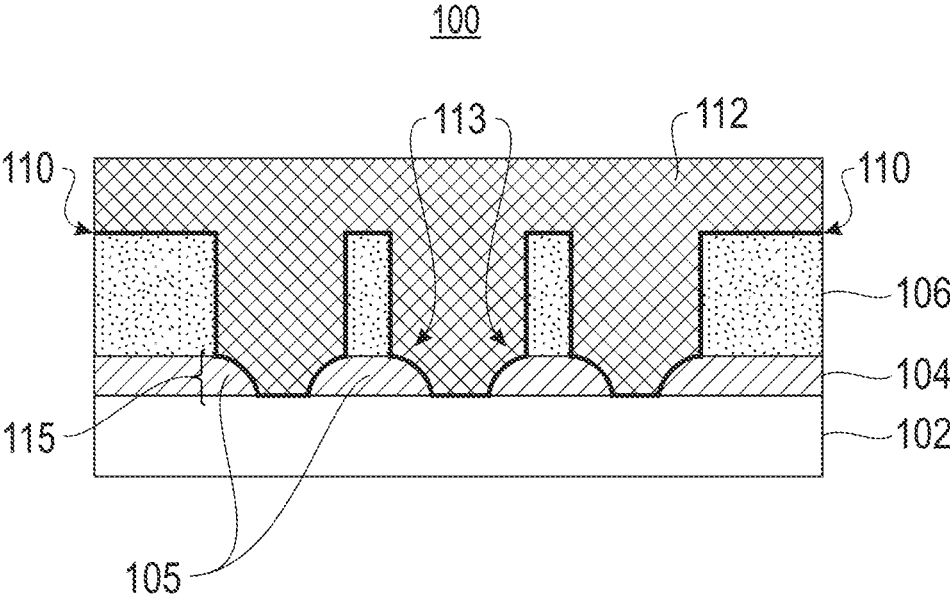
FIG. 7 is a cross-sectional view illustrating a process operation following that of FIG. 6, in accordance with embodiments of the disclosure.

FIG. 7 is a cross-sectional view illustrating a process operation following that of FIG. 6, in accordance with embodiments of the disclosure. As shown, a metal barrier layer 110 is shown deposited atop the second dielectric layer 106, the edges 105 of the first dielectric layer 104 and portions of the substrate 102 in the trenches. Also shown is a first metal fill 112 being deposited on top of the metal barrier layer 110. Materials that can be used for the metal barrier layer 110 include, for example, titanium nitride (TiN), tantalum nitride (TaN) and niobium nitride (NbN), which can be deposited using ALD, for example. Materials that can be used for the metal fill 112 include, for example, tungsten (W), ruthenium (Ru), molybdenum (Mo), rhodium (Rh), iridium (Ir) and cobalt (Co). Processes for deposition of the metal barrier layer 110 and the first metal fill 112 can be atomic layer deposition (ALD), CVD, physical vapor deposition (PVD), and electrochemical deposition, for example. Other suitable processes of deposition and materials for the metal barrier layer 110 and the first metal fill 112 are also contemplated.

In FIG. 7, the first metal fill 112, as shown, forms inwardly curved edges 113 that are located between the edges 105 of the first dielectric layer 104. The inwardly curved edges 113 have an inverse shape to that shape of the first dielectric layer's 104 edges 105. The shape of the inwardly curved edges 113 on a lower portion 115 of the metal fill 112 can vary in shape from that shown in FIG. 7. The width of the lower portion 115 of the first metal fill 112 is less than the width of the remainder of the first metal fill 112. An aspect ratio of the lower portion 115 is less than an aspect ratio of the remainder of the first metal fill 112. The "aspect ratio" of the first metal fill 112 is defined as height divided by width. As a result of a lower aspect ratio of the lower portion 115, advantageously there can be a reduced chance of metal gapfill and line wiggling due to a portion of the first metal fill 112 having a lower aspect ratio. Metal gapfill can be difficult to perform during metallization of small features, such as the trenches in the semiconductor structure 100 that can be about twenty to thirty (20-30) nanometers (nm) in width, for example. "Metal gapfill" can be defined as a metal fill without the presences of gaps in the metal material, and filling the trenches into which a metal material is deposited.

Figure 8:
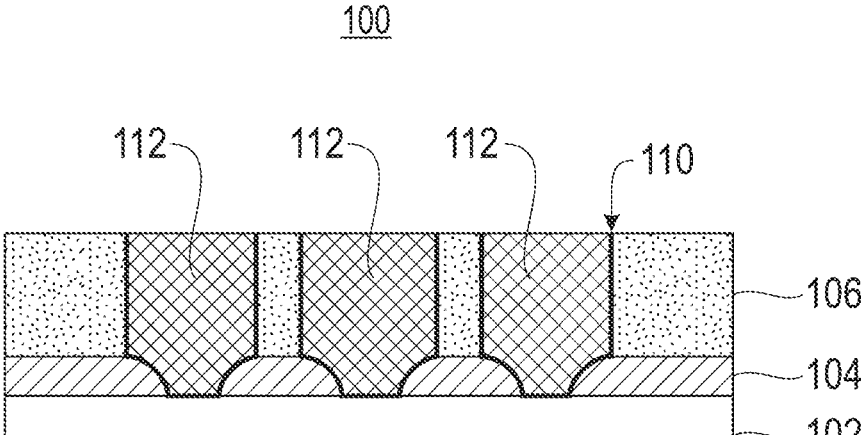
FIG. 8 is a cross-sectional view illustrating a process operation following that of FIG. 7, in accordance with embodiments of the disclosure.

FIG. 8 is a cross-sectional view illustrating a process operation following that of FIG. 7, in accordance with embodiments of the disclosure. The figure shows the structure 100 after a chemical mechanical planarization (CMP) process has taken place. As a result of the CMP process, a top portion of the first metal fill 112 is shown removed from above the second dielectric layer 106 in the structure 100.

Figure 9:
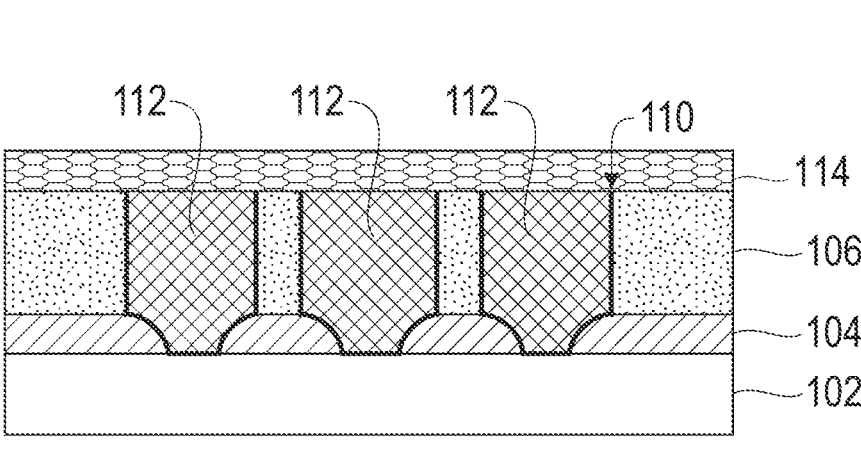
FIG. 9 is a cross-sectional view illustrating a process operation following that of FIG. 8, in accordance with embodiments of the disclosure.

FIG. 9 is a cross-sectional view illustrating a process operation following that of FIG. 8, in accordance with embodiments of the disclosure. The structure 100 shown includes a third dielectric layer 114 (otherwise referred to as "third dielectric substrate') deposited above the first metal fill 112 portions that remain after the CMP described above. The third dielectric layer 114 can be composed of any suitable material including those described with respect to the first dielectric layer 104 or can be a different material than the first dielectric layer 104. An example material for the third dielectric layer 114 can be a low-k dielectric material, such as e.g., graded SiCOH, or SiCOH. The third dielectric layer 114 includes an inverse density gradient. It is "inverse" to the density gradient of the first dielectric layer 104. The third dielectric layer 114 becomes more dense, and thereby harder to etch, as the layer moves away from the second dielectric layer 106 and the metal fill 112.

Figure 10:
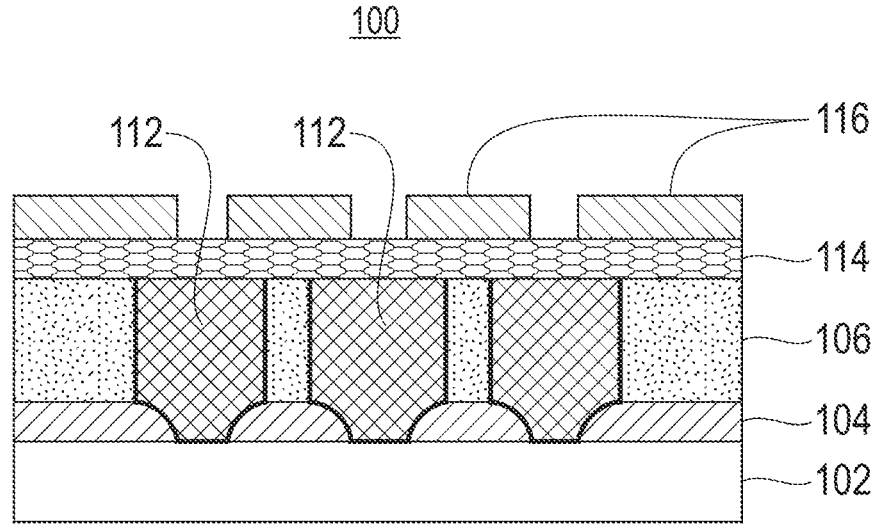
FIG. 10 is a cross-sectional view illustrating a process operation following that of FIG. 9, in accordance with embodiments of the disclosure.

FIG. 10 is a cross-sectional view illustrating a process operation following that of FIG. 9, in accordance with embodiments of the disclosure. As shown, a second hard mask layer 116 was deposited and patterned. The second hard mask layer 116 can be formed by any method known in the art for forming a hard mask including CVD, PECVD, and sputtering. For an embodiment, the second hard mask layer 116 can be formed from a bulk material such as Ti. Other bulk materials that can be used for the second hard mask layer 116 include materials known in the art. Moreover, the second hard mask layer 116 can be formed by processes known in the art to form a hard mask. The figure also shows that patterning of the second hard mask layer 116 has been carried out to form a plurality of openings (or spaces) in the second hard mask layer 116. These openings are narrow, and above each of the prior metal fills 112. Lithography and an RIE or a wet etch process, for example, can be used to pattern the second hard mask layer 116.

Figure 11:
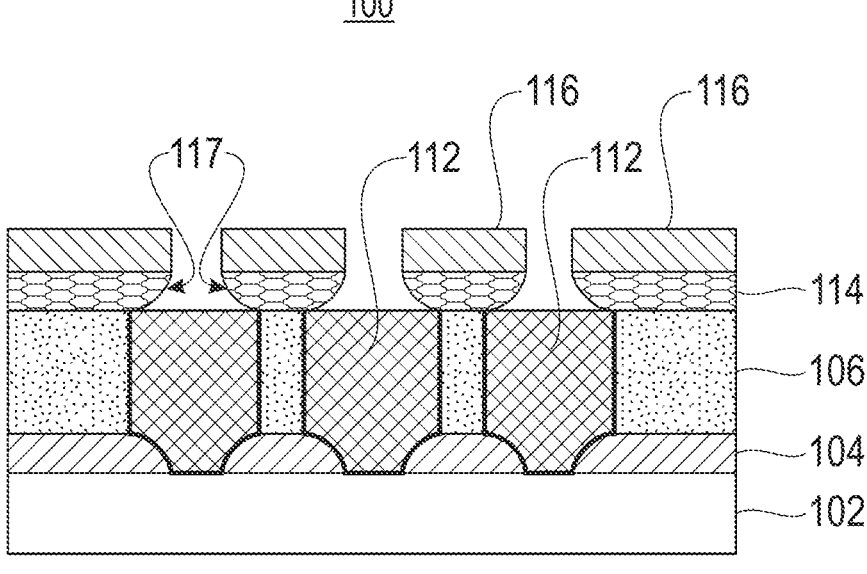
FIG. 11 is a cross-sectional view illustrating a process operation following that of FIG. 10, in accordance with embodiments of the disclosure.

FIG. 11 is a cross-sectional view illustrating a process operation following that of FIG. 10, in accordance with embodiments of the disclosure. An etching process, such as an RIE process, has been used to remove portions of the third dielectric layer 114 that are not covered by the second hard mask layer 116. By the etching process, trenches are formed between portions of the third dielectric layer 114. As shown, more lateral etch resulted at the bottom of the third dielectric layer 114 due to the inverse density gradient of the material in order to form curved edges 117 in the third dielectric layer 114.

Figure 12:
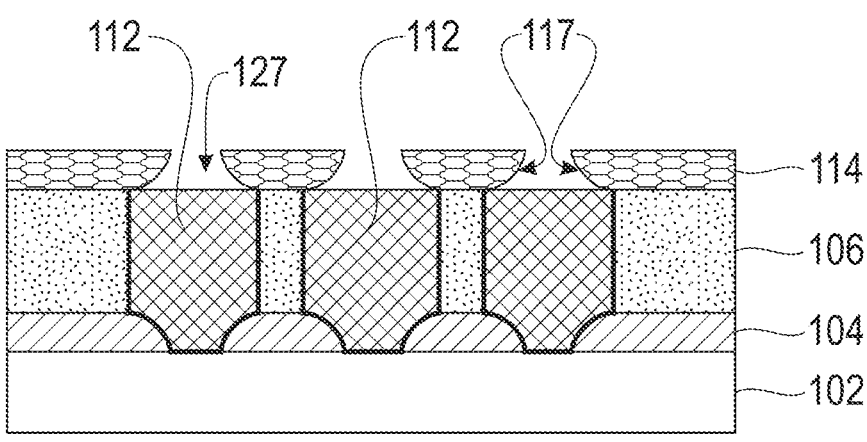
FIG. 12 is a cross-sectional view illustrating a process operation following that of FIG. 11, in accordance with embodiments of the disclosure.

FIG. 12 is a cross-sectional view illustrating a process operation following that of FIG. 11, in accordance with embodiments of the disclosure. As shown, the second hard mask layer 116 (as in FIG. 11) has been removed. A process that can be used to remove the second hard mask layer 116 is a wet removal process or a removal by a dry etch, such as an RIE. As shown, the etching of the third dielectric layer 114 above each of the first metal fills 112 forms openings 127 above each of the first metal fills 112. As a result of the etching, the third dielectric layer 114 includes curved or tapered edges 117 that extend inward in the openings 127.

Figure 13:
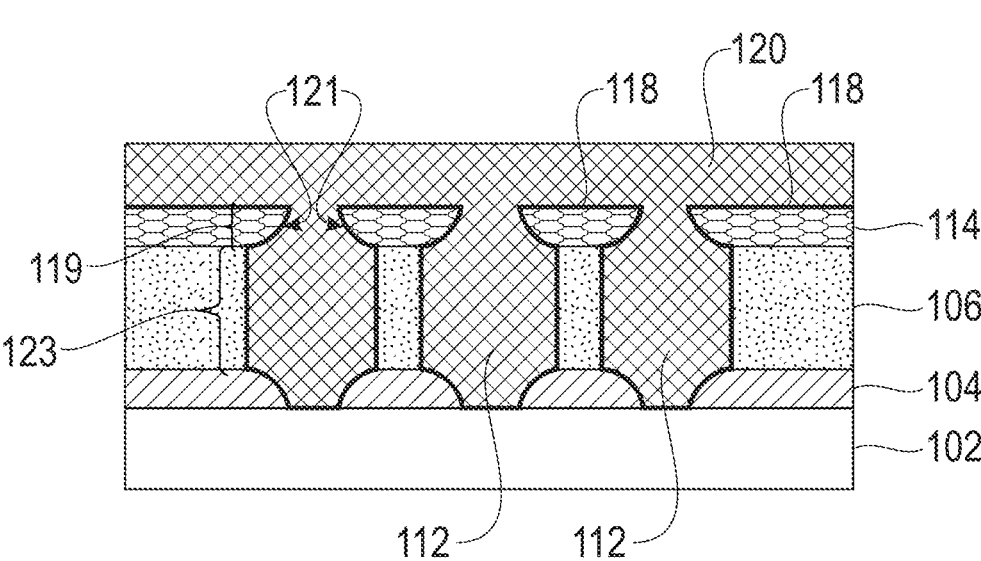
FIG. 13 is a cross-sectional view illustrating a process operation following that of FIG. 12, in accordance with embodiments of the disclosure.

FIG. 13 is a cross-sectional view illustrating a process operation following that of FIG. 12, in accordance with embodiments of the disclosure. As shown, a second metal barrier layer 118 has been selectively deposited on the third dielectric layer 114 (i.e., nucleating only on the third dielectric layer 114), but not on the first metal fill 112. Next, the second metal barrier layer 118 is followed by a second metal fill 120 being deposited on the second metal barrier layer 118 and on the top of the first metal fill 112. Materials that can be used for the second metal barrier layer 118 include, for example, TiN, TaN and NbN, which can be deposited using ALD, for example. Materials that can be used for the second metal fill 120 include, for example, W, Ru, Mo, Rh, Ir and Co. Processes for deposition of the second metal barrier layer 118 and the second metal fill 120 can be, for example, PVD, ALD, CVD, and electrochemical deposition, including selective deposition. Other suitable processes and materials for the second metal barrier layer 118 and the second metal fill 120 are also contemplated.

In FIG. 13, the second metal fill 120, as shown, forms inwardly curved edges 121 that are located between the edges 117 (see FIG. 11) of the third dielectric layer 114. The inwardly curved edges 121 have an inverse shape to that shape of the edges 117 of the third dielectric layer 114. The shape of the inwardly curved edges 121 on an upper portion 119 of the second metal fill 120 in the trenches can vary in shape from that shown in FIG. 13. The width of the upper portion 119 is less than the width of a middle portion 123 of the first metal fill 112. An aspect ratio of the upper portion 119 is less than an aspect ratio of the middle portion 123 of the first metal fill 112. As a result of a lower aspect ratio of the upper portion 119, advantageously there can be a reduced chance of metal gapfill and line wiggling due to a portion of the second metal fill 120 having a lower aspect ratio.

Figure 14:
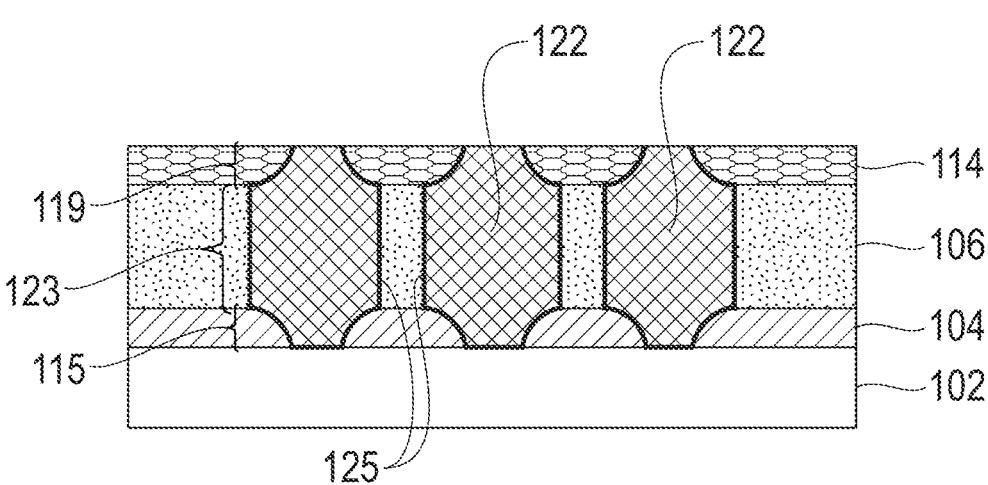
FIG. 14 is a cross-sectional view illustrating a process operation following that of FIG. 13, in accordance with embodiments of the disclosure.

FIG. 14 is a cross-sectional view illustrating the structure 100 after a process operation following that of FIG. 13, in accordance with embodiments of the disclosure. The figure shows the structure 100 of FIG. 13 after a CMP process has taken place. As a result of the CMP process, an upper portion of the second metal fill 120 is shown removed from above the third dielectric layer 114 in the structure 100. The resultant structure 100, as shown, includes a plurality of metal wires 122 with each having a widened middle portion 123 with improved line CD and height. The widened middle portions 123 can be locally widened CDs of the metal wires 122. The metal wires 122 include tapered lower portions 115 and tapered upper portions 119. The first dielectric material layer 104 included a low-k dielectric material with a density gradient adjacent the tapered (or curved) lower portion 115 of each metal wire 122. The third dielectric material layer 114 included a low-k dielectric material with an inverse density gradient adjacent the tapered (or curved) upper portion 119 of each metal wire 122. Sidewalls 125 of each metal wire 122 can have angles of ninety (90) degrees with regard to the substrate 102. The sidewalls 125 and the substrate 102 can be perpendicular to each other. The sidewalls 125 can be substantially straight.

FIG. 15 is an embodiment of the disclosure, which is a method or process 200 of manufacturing a semiconductor structure 100. An operation 210 of the process 200 can be forming a first dielectric layer 104 on and over a substrate 102. The first dielectric layer 104 includes a density gradient. Another operation 220 can be forming a second dielectric layer 106 on and over the first dielectric layer 104. An additional operation 230 can be etching both the first dielectric layer 104 and the second dielectric layer 106 to form a plurality of vias 109. After the etching, the second dielectric layer 106 forms substantially straight sidewalls 111 of the plurality of vias 109. The first dielectric layer 104 includes curved or tapered edges 105 that extend inward from the sidewalls 111 and expose the substrate 102 between the curved or tapered edges 105. A further operation 240 can be depositing a first barrier layer 110 in the plurality of vias 109. An additional operation 250 can be depositing a first metal fill 112 in each of the plurality of vias 109 over the first barrier layer 110. Yet a further operation 260 can be forming a third dielectric layer 114 on and over the first metal fill 112 and the second dielectric layer 106. The third dielectric layer 114 includes an inverse density gradient. Another operation 270 can be etching the third dielectric layer 114 above each of the first metal fills 112 to form openings 127 above each of the first metal fills 112. The etching results in the third dielectric layer 114 that includes curved or tapered edges 117 that extend inward in the openings 127. Another operation 180 can be depositing a second barrier layer 118 on and over the third dielectric layer 114 after etching. Yet another operation 290 can be depositing a second metal fill 120 in each of the openings 127. One of the first metal fills 112 and one of the second metal fills 120 together form a metal wire 122 in the semiconductor structure 100.

The process 200 can also include additional or alternative steps. For example, the process 200 can include further operations of forming a first hard mask layer 108 on and over the second dielectric layer 106 prior to the etching of both the first dielectric layer 104 and the second dielectric layer 106, and removing the first hard mask layer 108 after the etching of the first dielectric layer 104 and the second dielectric layer 106. Also, the process 200 can include operations of forming a second hard mask layer 116 on and over the third dielectric layer 114 prior to the etching of the third dielectric layer 114, and removing the second hard mask layer 116 after the etching of the third dielectric layer 114.

For purposes of description herein, the terms "upper," "lower," "top," "bottom," "left," "right," "rear," "front," "vertical," "horizontal," "frontside," "backside," and derivatives thereof shall relate to the devices as oriented in the figures. However, it is to be understood that the devices can assume various alternative orientations and step sequences, except where expressly specified to the contrary. It is also to be understood that the specific devices and processes illustrated in the attached drawings, and described in the following disclosure, are simply exemplary embodiments of the inventive concepts defined in the appended claims. Hence, other physical characteristics relating to the embodiments disclosed herein are not to be considered as limiting, unless the claims expressly state otherwise.

For purposes of this description, certain aspects, advantages, and novel features of the embodiments of this disclosure are described herein. The disclosed processes, and systems should not be construed as being limiting in any way. Instead, the present disclosure is directed toward all novel and nonobvious features and aspects of the various disclosed embodiments, alone or in various combinations and sub-combinations with one another. The processes, and systems are not limited to any specific aspect or feature or combination thereof, nor do the disclosed embodiments require that any one or more specific advantages be present, or problems be solved.

Although the operations of some of the disclosed embodiments are described in a particular, sequential order for convenient presentation, it should be understood that this manner of description encompasses rearrangement, unless a particular ordering is required by specific language set forth below. For example, operations described sequentially can in some cases be rearranged and/or performed concurrently. Moreover, for the sake of simplicity, the attached figures may not show the various ways in which the disclosed processes can be used in conjunction with other processes. Additionally, the description sometimes uses terms like "provide" or "achieve" to describe the disclosed processes. These terms are high-level abstractions of the actual operations that are performed. The actual operations that correspond to these terms can vary depending on the particular implementation and are readily discernible by one of ordinary skill in the art.

As used in this application and in the claims, the singular forms "a," "an," and "the" include the plural forms unless the context clearly dictates otherwise. Additionally, the term "includes" means "comprises."

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A semiconductor structure comprising:
   a bottom substrate;
   a plurality of metal wires, wherein the plurality of metal wires directly contact the bottom substrate; and
   at least one dielectric substrate surrounding the plurality of metal wires, wherein each of the plurality of metal wires includes a tapered upper portion, a tapered lower portion, and a middle portion between the tapered upper portion and the tapered lower portion that is wider than the tapered upper portion and the tapered lower portion, and wherein the at least one dielectric substrate includes
   a first dielectric substrate comprising a first material containing a low-k dielectric material with a density gradient adjacent the tapered lower portion of each metal wire,
   a second dielectric substrate comprising a second material containing a dielectric material, and
   a third dielectric substrate comprising a third material containing a low-k dielectric material with an inverse density gradient adjacent the tapered upper portion of each metal wire,
   wherein the second dielectric substrate is located between the first dielectric substrate and the third dielectric substrate.

2. The semiconductor structure of claim 1, wherein each of the plurality of metal wires includes a barrier layer, and a metal fill.

3. The semiconductor structure of claim 2, wherein the metal fill is a material selected from a group consisting of ruthenium, tungsten, cobalt, iridium and rhodium.

4. The semiconductor structure of claim 2, wherein the barrier layer is a material selected from a group consisting of titanium nitride, tantalum nitride and niobium nitride.

5. The semiconductor structure of claim 1, wherein the middle portion of each of the plurality of metal wires includes a locally widened critical dimension of the plurality of metal wires.

6. The semiconductor structure of claim 1, wherein a pitch between the plurality of metal wires is below 30 nanometers.

7. The semiconductor structure of claim 1, wherein the plurality of metal wires each include a plurality of metal fill layers each including portions thereof having a low aspect ratio.

8. A semiconductor structure comprising:
   a bottom substrate;
   a plurality of metal wires, wherein the plurality of metal wires directly contact the bottom substrate; and
   at least one dielectric substrate surrounding the plurality of metal wires,
   wherein each of the plurality of metal wires includes a curved upper portion, a curved lower portion, and a middle portion between the curved upper portion and the curved lower portion that includes a substantially straight sidewall that is wider than the curved upper portion and the curved lower portion, and wherein the at least one dielectric substrate includes
   a first dielectric substrate comprising a first material containing a low-k dielectric material with a density gradient adjacent the curved lower portion of each metal wire,
   a second dielectric substrate comprising a second material containing a dielectric material, and
   a third dielectric substrate comprising a third material containing a low-k dielectric material with an inverse density gradient adjacent the curved upper portion of each metal wire,
   wherein the second dielectric substrate is located between the first dielectric substrate and the third dielectric substrate.

9. The semiconductor structure of claim 8, wherein each of the plurality of metal wires includes a barrier layer, and a metal fill.

10. The semiconductor structure of claim 9, wherein the metal fill is a material selected from a group consisting of ruthenium, tungsten, cobalt, iridium and rhodium.

11. The semiconductor structure of claim 9, wherein the barrier layer is a material selected from a group consisting of titanium nitride, tantalum nitride and niobium nitride.

12. The semiconductor structure of claim 8, wherein the middle portion of each of the plurality of metal wires includes a locally widened critical dimension of the plurality of metal wires.

13. The semiconductor structure of claim 8, wherein a pitch between the plurality of metal wires is below 30 nanometers.

14. The semiconductor structure of claim 8, wherein the plurality of metal wires each include a plurality of metal fill layers each including portions thereof having a low aspect ratio.

* * * * *